United States Patent [19]

Unger et al.

[11] Patent Number: 4,780,629
[45] Date of Patent: Oct. 25, 1988

[54] NETWORK FOR PROCESSING HIGH-BIT-WIDTH DATA COMPRISING A TRANSMITTER AND A PLURALITY OF RECEIVERS

[75] Inventors: Bernhard Unger; Rainer Rauschert, both of Munich, Fed. Rep. of Germany

[73] Assignee: Siemens Aktiengesellschaft, Berlin and Munich, Fed. Rep. of Germany

[21] Appl. No.: 908,771

[22] Filed: Sep. 18, 1986

[30] Foreign Application Priority Data

Sep. 25, 1985 [DE] Fed. Rep. of Germany ....... 3534221

[51] Int. Cl.⁴ .................... H03K 5/15; H03K 19/01
[52] U.S. Cl. .................................. 307/475; 307/244; 307/270; 328/105; 328/153
[58] Field of Search ............... 307/475, 455, 467, 244; 328/105, 153, 112, 113; 370/85

[56] References Cited

U.S. PATENT DOCUMENTS

| | | | |
|---|---|---|---|
| 3,648,061 | 3/1972 | Black et al. | 307/218 |
| 4,346,312 | 8/1982 | Christopherson | 307/270 |
| 4,359,647 | 11/1982 | Trinkl | 307/238 |
| 4,386,282 | 5/1983 | Scavuzzo | 377/81 |
| 4,517,476 | 5/1985 | Barre | 307/455 |
| 4,532,440 | 7/1985 | Barre | 307/455 |
| 4,605,871 | 8/1986 | Price et al. | 307/455 |
| 4,616,358 | 10/1986 | Rehm et al. | 370/58 |
| 4,628,216 | 12/1986 | Mazumder | 307/455 |
| 4,661,721 | 4/1987 | Ushiku | 328/105 |
| 4,675,553 | 6/1987 | Price et al. | 307/455 |
| 4,686,394 | 8/1987 | Lam | 307/455 |
| 4,686,674 | 8/1987 | Lam | 370/112 |

FOREIGN PATENT DOCUMENTS

| | | |
|---|---|---|
| 0086434 | 8/1983 | European Pat. Off. . |
| 0144218 | 6/1985 | European Pat. Off. . |
| 2821231 | 5/1979 | Fed. Rep. of Germany . |
| 3147547 | 6/1983 | Fed. Rep. of Germany . |

OTHER PUBLICATIONS

Miller et al., "ECL-Type Register", IBM Technical Disclosure Bulletin, vol. 22, No. 8B, Jan. 1980, pp. 3676-3677.

Primary Examiner—Stanley D. Miller
Assistant Examiner—Richard Roseen
Attorney, Agent, or Firm—Hill, Van Santen, Steadman & Simpson

[57] ABSTRACT

In order to enable the control of plurality of receivers in CML technology comprising two or three levels of series gating by way of a transmitter whose maximum fanout is smaller than the total number of receivers, the emitter followers provided for level shifting of the control signal for a differential amplifier of the second or third series-gated switch level in each receiver are omitted and are replaced by a common emitter follower having increased performance capability for a respective group of n2 receivers. The invention finds application in 2-bit multiplexers and register stages.

3 Claims, 3 Drawing Sheets a)

b)

c)

NETWORK FOR PROCESSING HIGH-BIT-WIDTH DATA COMPRISING A TRANSMITTER AND A PLURALITY OF RECEIVERS

BACKGROUND OF THE INVENTION

1. Field of the Invention

The present invention relates to a network in CML technology for processing data having a large data bit-width, and in particular to such a network which comprises a transmitter having a predetermined loadability and a plurality of receivers having differential amplifiers (current switches) in two or three series-gating stages, whereby the total number of receivers considerably exceeds the loadability of the transmitter and the total number of the receivers is divided into groups of n2 receivers each.

2. Description of the Prior Art

In large data processing systems, the data to be processed have considerable bit-widths (lengths) of, for example, 72 bits which must be processed in parallel. With an increase in degree of integration and a growing number of terminal pins, it becomes possible to process large portions of, or even the full data word in parallel, in a large scale integrated circuit (LSI). The result of this internally, is that in resigers and multiplexers, for example, the control signal must select n inputs of logic elements (clock or address inputs, for example) for a data word having the bit-width n.

The number of inputs of connected receivers controllable by a transmitter, the so-called fan out, is limited by the loadability of the transmitter and is likewise rigidly prescribed given in integrated circuits which are manufactured in accordance with the master-slice method and contain a supply of components divided into a plurality of areas having prescribed dimensioning. The fan-out n1 of the sub-circuits or cells usually selectable with the assistance of a cell library, of the sub-circuits comprising bipolar transistors in CML technology, predominantly amounts to about eight. This value also forms the basis for the following comments, whereby the same considerations hold true, of course, for deviating values.

Given large bit-widths n, the number of receivers is frequently far greater than the allowable fan-out n1 of the transmitter. It is then possible to employ additional amplifiers which are controlled by the transmitter and which, in turn, respectively control n1 receivers. In this manner, therefore, $(n1)^2$ receivers can be supplied. OR gates in FIG. 1 are usually employed as amplifiers. Such a network comprises the structures schematically illustrated in FIG. 2 having a transmitter S, amplifiers V and receivers E.

What is disadvantageous in the utilization of amplifiers is the increase of the signal delay time, the power dissipation and the number of cells. Added thereto is that amplifiers must be connected in series given more than $(n1)^2$ receivers.

A further possibility for increasing the number of receivers controllable by transmitter is comprised in enlarging the fan-out of the circuit cell serving as a transmitter. The selection thereby remains limited to twice or three times the driver capability, since the number of components required in such circuit cells increases greatly. Although the signal delay time is not initially enlarged, additional amplifiers must again be provided in those cases in which even the increased driver capability is not adequate to drive all existing receivers.

The structure of a network comprising a transmitter SV having k times the driver capability is schematically illustrated in FIG. 3.

SUMMARY OF THE INVENTION

The object of the present invention, therefore, is to provide a cell structure for register cells or multiplexer cells in CML technology comprising two or three levels of series gating for processing data words having large bit-widths n wherein a plurality of receivers can be controlled by a transmitter, whereby these networks exhibit a considerably smaller power-delay product and should require fewer components per bit than the networks heretofore known and discussed above.

According to the present invention, the above object is achieved in a CML network of the type described which is particularly characterized in that the input emitter followers usually provided for driving the differential amplifiers (current switches) of the second and third series gating level in each receiver is omitted and is replaced by a common emitter follower cell of increased performance capability for a group of receivers, and in that the inputs of the common emitter follower cells are connected to the output of the transmitter.

BRIEF DESCRIPTION OF THE DRAWINGS

Other objects, features and advantages of the invention, its organization, construction and operation, will be best understood from the following detailed description, taken in conjunction with the accompanying drawings, on which.

DESCRIPTION OF THE PREFERRED EMBODIMENTS

Figure 1:
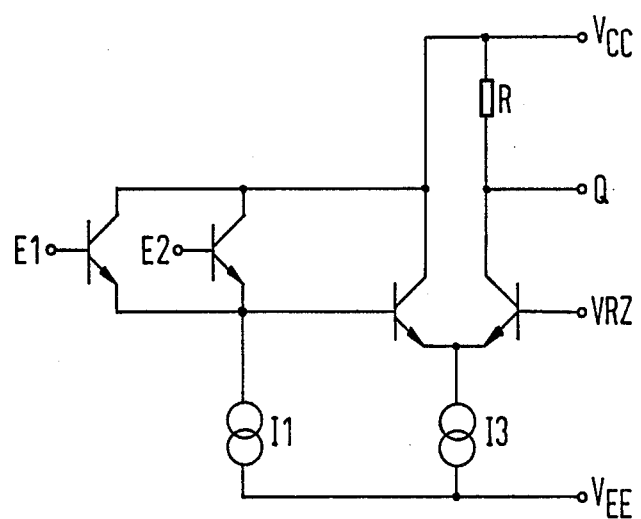
FIG. 1 is a circuit diagram of a two input OR gate usually employed as an amplifier.
Figure 2:
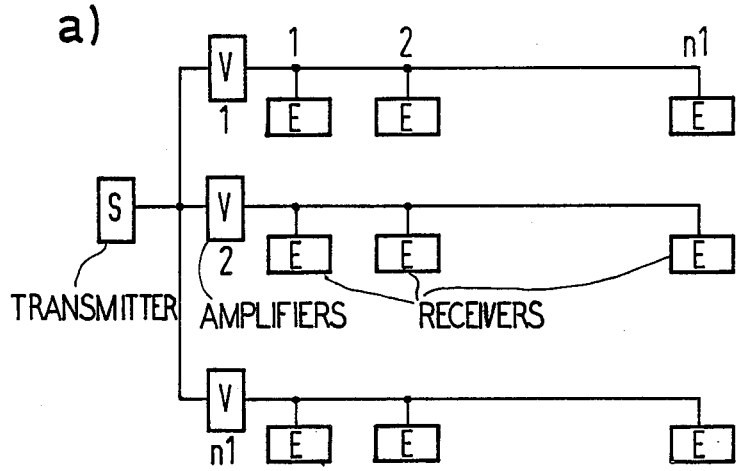
FIG. 2 is a schematic representation of a network with a transmitter S driving a plurality of receivers E via a plurality of amplifiers V.
Figure 3:
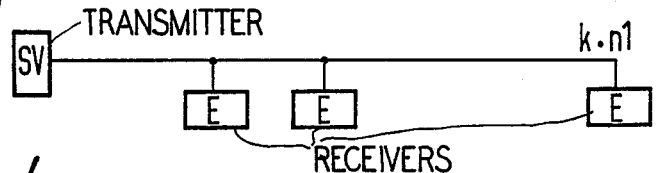
FIG. 3 is a schematic representation of a network comprising the transmitter SV which has k times the driving capability and which controls a plurality of receivers E.
Figure 4:
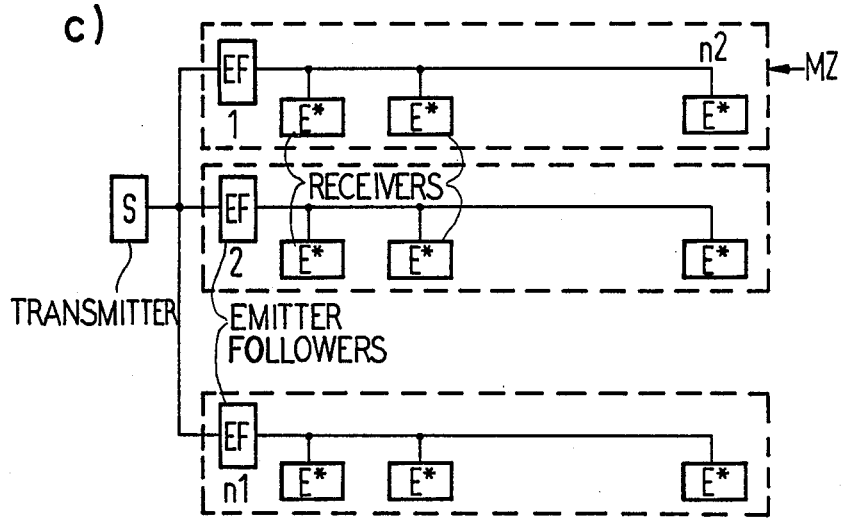
FIG. 4 is a schematic representation of a network constructed in accordance with the present invention.

Analogous to the illustrations of FIGS. 2 and 3, FIG. 4 illustrates a schematic circuit diagram constructed in accordance with the present invention in which a transmitter S with a fan-out n1 and, accordingly, small n1 groups MZ each having n2 receivers E*. Each group MZ of receivers E* is driven by a two-stage emitter follower EF having increased driving capability. One such receiver group MZ, comprising the preceding emitter follower EF, is referred to below as a multiple cell.

Figure 5:
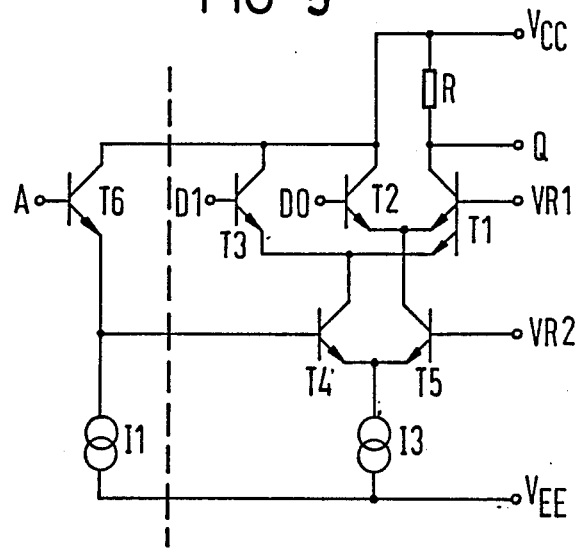
FIG. 5 is a schematic circuit diagram of a 2-bit multiplexer known in the art.
Figure 6:
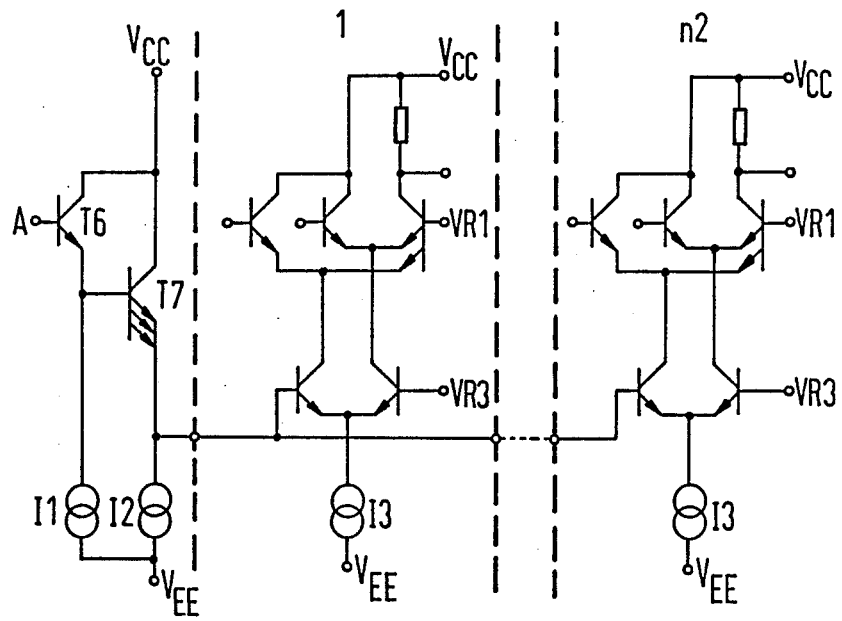
FIG. 6 is a schematic circuit diagram of a circuit arrangement constructed in accordance with the present invention and comprising a plurality of multiplexers.

Before the detailed illustration of an exemplary embodiment of a multiple cell comprising 2-bit multiplexers is set forth in FIG. 6, FIG. 5 shall be referenced, this showing a standard 2-bit multiplexer cell in CML technology with series gating. The multiplexer cell contains three differential amplifiers, of which the two upper differential amplifiers of the first series-gated switch level comprise a shared double emitter transistor T1. The collector of the transistor T1 is connected to the output Q and, via a collector resistor R, to the terminal $V_{CC}$ of voltage source serving as a reference potential. The base of the transistor T1 is connected to a first reference potential VR1. Insofar as the component supply of the master-slice arrangement does not contain any double-emitter transistors, the transistor T1 can also be realized by two simple transistors whose collectors, first, and whose base terminals, second, are connected in parallel.

Together with the transistor T1, the transistor T2 at whose base a first data bit D0 is applied forms a first differential amplifier. A second differential amplifier controlled by the second data bit D1 arises on the basis of the interaction of the transistor T1 with the transistor T3.

The emitters of the transistors T1, T2 or, respectively, T1, T3 of the first or the second differential amplifier, these emitters being connected to one another in pairs, are connected to the collectors of the emitter-coupled transistors T4 or, respectively, T5 of the third differential amplifier which is assigned to a second series-gated switch level.

The setting of the third differential amplifier decides whether the constant current source I3 is supplied to the first or the second differential amplifier, i.e., whether the first or the second data bit D0 or D1 is connected through to the output Q. By way of an emitter follower comprising the transistor T6 and a current source I1, the differential amplifier or the second series-gated switch level is controlled by an address bit A. The emitter follower causes such a level shift of the binary values of the address bit A that the mean value of the shifted signal levels corresponds to the reference potential VR2. The circuit portion of the 2-bit multiplexer lying to the right of the vertical broken line in FIG. 5 shall be referred to below as a rump cell.

FIG. 6 illustrates a multiple 2-bit multiplexer cell MZ constructed in accordance with the present invention and comprising a total of n2 rump cells, of which the first and last are shown. A comparison to FIG. 5 readily illustrates the coincidence in terms of circuit structure with the rump cells set forth in detail with reference to FIG. 5. In order to simplify the drawing, reference characters have therefore been largely omitted.

The control inputs of the third differential amplifiers of the rump cells are connected in parallel and are connected to the output of an emitter follower cell controlled by the address bit A. The emitter follower cell is composed of two series-connected emitter followers, whereby the first emitter follower comprising the transistor T6 and the current source I1 is identical to the emitter follower set forth above with reference to FIG. 5. The following, second emitter follower comprising a transistor T7 with increased current load-ability is operated with a higher current from the constant current source I2. The transistor T7, for example, can be realized by the parallel connection of the corresponding terminals of two or three transistors from the normal component supply.

A difference between a rump cell of FIG. 5 and the rump cells of FIG. 6 is in the magnitude of the reference potential for the third differential amplifier which was originally assigned to the second series-gated switch level and now belongs to the third series-gated switch level. When defining the reference potential VR3 of the rump cells of FIG. 6, in particular, twice the signal level shift of the binary values of the address bit A must be taken into consideration by the two-stage emitter follower cell T6, T7.

Under the conditions which hold true for all examples up to now, it is recommended not to increase the maximum fan-out of the emitter follower cell above 16, since excessively great differences in propagation delay for leading and trailing signal edges would otherwise occur. Even with this limitation, 128 receivers can be supplied by a transmitter having the maximum fanout n1 = 8.

The application of the measures of the present invention is not limited to 2-bit multiplexers, but encompasses all circuit arrangements in CML technology having two levels or three levels of series gating wherein a common control signal for controlling differential amplifiers in the second or third series-gated switch level is to be respectively effective for a plurality of such circuit arrangements.

Typical examples of such circuit arrangements are register stages (cf. German Pat. No. 31 47 547 and German Pat. No. 28 21 231) for registers for parallel data input and/or output or for shift registers. In these cases, also, rump cells are formed by omitting the input emitter followers for the input of the clock pulses at the individual register stages and multiple cells are then formed from a plurality of rump cells and a preceding, common emitter follower cell. The general structure of a network comprising the transmitter S and comprising n1 multiple cells MZ which are respectively composed of one emitter follower cell EF and n2 rump cells E* as receivers, is illustrated in FIG. 4, as already mentioned above.

For the following comparison of the network structures set forth, the network structure of FIG. 2 is referred to as case (a), the network structure of FIG. 3 is referred to as case (b), and the network structure of FIG. 4 as case (c). Network simulations have been carried out and were thereby based on 2-bit multiplexers and the following values:

| Fanout n1 = | 8 |
|---|---|
| Current I1 = | 0.5 mA |
| Current I2 = | 1.5 mA |
| Current I3 = | 1.5 mA |
| Resistor R = | 300 ohms |
| Operating Voltage $V_{EE}-V_{CC}$ = | −4.5 V |

In case (b), the differential amplifier current of the transmitter is 2I3 = 3 mA.

For various bit widths n, the following table illustrates the maximum address propagation delay $t_{dA}$, the power-delay product $P_v \cdot t_{dA}$ per bit and the number m of components per bit for cases (a), (b) and (c).

| | Case (a) | | | Case (b) | | | Case (c) | |
|---|---|---|---|---|---|---|---|---|
| | $t_{dA}$ | $P_v \cdot t_{dA}$ | | $t_{dA}$ | $P_v \cdot t_{dA}$ | | $t_{dA}$ | |
| n | ps | pJ | m | ps | pJ | m | ps | $P_v \cdot t_{dA}$ | m |
| 8 | 680 | 6.1 | 12 | 580 | 5.7 | 12.3 | 625 | 4.9 | 10 |

-continued

| n | Case (a) tdA ps | Pv·tdA pJ | m | Case (b) tdA ps | Pv·tdA pJ | m | Case (c) tdA ps | Pv·tdA pJ | m |
|---|---|---|---|---|---|---|---|---|---|
| 16 | 1060 | 10.7 | 13 | 680 | 6.4 | 12.1 | 735 | 5.4 | 9.5 |
| 32 | 1110 | 11.2 | 13 | 1035 | 10.6 | 12.7 | 760 | 5.6 | 9.5 |
| 64 | 1210 | 12.3 | 13 | 1060 | 10.7 | 12.7 | 810 | 5.9 | 9.5 |
| 128 | 1590 | 16.3 | 13.1 | 1110 | 11.1 | 12.6 | 910 | 6.7 | 9.5 |
| 256 | 1640 | 16.8 | 13.1 | 1210 | 12.1 | 12.6 | 1290 | 9.5 | 9.6 |
| 512 | 1740 | 17.9 | 13.1 | 1565 | 15.7 | 12.4 | 1340 | 9.9 | 9.6 |

The above table illustrates a clear superiority of the network structure of the case (c) of the present invention even for bit widths $n \geq 16$ in view of all three result quantities investigated. This is also true of bit widths $n > 128$, even though additional amplifiers are then required.

Although we have described our invention by reference to particular illustrated embodiments, many changes and modifications of the invention may become apparent to those skilled in the art without departing from the spirit and scope of the invention. We therefore intend to include within the patent wanted hereon such changes and modifications as may reasonably and profitably be included within the scope of our contributions to the art.

We claim:

1. A network constructed in CML circuit technology for processing data having a large data bit width greater than 8, comprising:
   a transmitter having an output with a predetermined loadability;
   a plurality of receivers each including differential amplifiers connected for multi-level series gating, the total number n of receivers exceeding the loadability of said transmitter and the number n of receivers being divided into groups of n2 receivers in each group;
   a common emitter follower cell of increased performance capability of n fold of the performance capability of an individual emitter follower for each of said groups; and
   each of said common emitter follower cells comprising an input connected to the output of said transmitter and each said common emitter follower cell supplying an individual group of n2 receivers.

2. The network of claim 1, wherein:
   the loadability of the transmitter is n1 for supplying an address bit and $n > n1$ two-bit multiplexers are the receivers and address inputs of each multiplexer are receiver inputs.

3. The network of claim 1, wherein:
   the loadability of the transmitter is n1 for supplying clock pulses and $n > n1$ register stages are the receivers and clock inputs of each register stage are receiver inputs.

* * * * *